(12) United States Patent
Wigglesworth et al.

(10) Patent No.: US 8,865,861 B2
(45) Date of Patent: Oct. 21, 2014

(54) PECHMANN DYE BASED POLYMERS AND SEMICONDUCTOR COMPOSITIONS

(71) Applicant: Xerox Corporation, Norwalk, CT (US)

(72) Inventors: Anthony J. Wigglesworth, Oakville (CA); Yiliang Wu, Oakville (CA); Ping Liu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 34 days.

(21) Appl. No.: 13/728,205

(22) Filed: Dec. 27, 2012

(65) Prior Publication Data

US 2014/0183455 A1   Jul. 3, 2014

(51) Int. Cl.
*C08G 75/00* (2006.01)
*H01L 51/00* (2006.01)

(52) U.S. Cl.
CPC .................................. *H01L 51/0036* (2013.01)
USPC ........... 528/377; 528/163; 528/117; 528/378; 528/216; 528/380; 257/40; 257/66

(58) Field of Classification Search
USPC ................. 528/378, 163, 117, 216, 377, 380; 257/40, 66
See application file for complete search history.

(56) References Cited

U.S. PATENT DOCUMENTS

| | | | |
|---|---|---|---|
| 7,910,684 | B2 | 3/2011 | Li |
| 7,932,344 | B2 | 4/2011 | Li |

FOREIGN PATENT DOCUMENTS

| | | | | |
|---|---|---|---|---|
| JP | 2012109365 | * | 6/2012 | ............... H01L 51/42 |

OTHER PUBLICATIONS

Li et al., "Annealing-Free High-Mobility Diketopyrrolopyrrole-Quaterthiophene Copolymer for Solution-Processed Organic Thin Film Transistors", Journal of the American Chemical Society, Jan. 2011, pp. 2198-2204, vol. 133, American Chemical Society, available at http://pubs.acs.org.
Lei et al., "High-Performance Air-Stable Organic Field-Effect Transistors: Isoindigo-Based Conjugated Polymers", Journal of the American Chemical Society, Apr. 2011, pp. 6099-6101, vol. 133, American Chemical Society, available at http://pubs.acs.org.
Norsten et al., "Thiophene-Containing Pechmann Dye Derivatives", Organic Letters, Sep. 2010, pp. 4816-4819, vol. 12, No. 21, American Chemical Society, available at http://pubs.acs.org.

* cited by examiner

*Primary Examiner* — Shane Fang
(74) *Attorney, Agent, or Firm* — Pillsbury Winthrop Shaw Pittman LLP

(57) ABSTRACT

A Pechmann dye based polymer of formula 1, below, is provided.

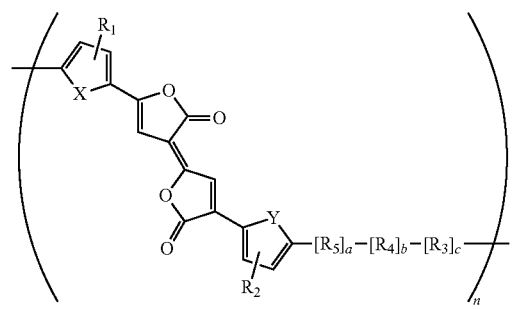

20 Claims, 1 Drawing Sheet

PECHMANN DYE BASED POLYMERS AND SEMICONDUCTOR COMPOSITIONS

TECHNICAL FIELD

The present disclosure is generally related to Pechmann dye based polymers, as well as film forming semiconductor compositions, organic thin-film transistors (OTFTs), and other electronic devices that include such polymers.

Application Ser. No. 13/728,194, filed contemporaneously herewith, entitled EXTENDED ISOINDIGO POLYMERS AND SEMICONDUCTOR COMPOSITIONS, by Anthony Wigglesworth, et al., the disclosure of which is incorporated herein in its entirety by reference, discloses extended isoindigo polymers which may likewise be used in semiconductor compositions, OTFTs, and other electronic devices.

BACKGROUND

Thin film transistors (TFTs) are basic components of many electronic devices, including sensors, image scanners, electronic displays, solar, and optoelectronic devices. TFTs are created by depositing on a supporting substrate (such as glass), a dielectric layer, upon which a channeling semiconductor layer and metallic contacts are deposited. TFTs can be made using various different materials, including organic compounds as part of the channeling semiconductor layer.

TFTs that use organic materials as part of the semiconducting layer are often referred to as organic thin film transistors (OTFTs). OTFTs can include a substrate, a dielectric, a semiconductor, and three electrically conductive electrodes (a gate, a source, and a drain). OTFTs can be made from various organic materials such as small molecules or polymers.

Organic thin-film transistors (OTFTs) can be used in applications such as radio frequency identification (RFID) tags and backplane switching circuits for display, including signage, readers, and liquid crystal displays, where high switching speeds and/or high density are not essential.

Advantages OTFTs offer can include reduced manufacturing costs, increased variability in device geometries, biodegradable electronics, and various attractive mechanical properties depending on the application, e.g., compactness, light weight, and flexibility.

SUMMARY

The semiconductor layers of OTFTs can be fabricated using low-cost solution-based patterning and deposition techniques, such as spin coating, solution casting, dip coating, stencil/screen printing, flexography, gravure, offset printing, ink jet-printing, micro-contact printing, and the like. These solution-based processes use solution processable materials.

However, some organic or polymeric semiconductor compositions formed by solution processing tend to suffer from limited solubility, air sensitivity, and especially low field-effect mobility. These drawbacks can, in some cases, limit the usefulness of fabricating organic or polymer TFTs using liquid deposition and patterning processes. Therefore, when selecting a polymer for producing an OTFT, various performance properties should be considered.

At least two performance properties to consider when fabricating OTFTs are carrier mobility and the on/off ratio. Mobility is measured in units of $cm^2/(V \cdot sec)$ and higher mobility is typically desired. The on/off ratio is the ratio between the amount of current that leaks through the OTFT in the off state, versus the current that runs through the OTFT in the on state. Typically, a higher on/off ratio is more desirable.

Despite the advances in the development of semiconducting polymers and related materials for use in photovoltaic devices, materials and material processing that (1) improve the performance of these devices, (2) maintain a good solubility in non-toxic solvents and (3) have a good environmental stability remains challenging. It is believed that the prospective Pechmann dye based polymers in the present disclosure have higher mobility, decreased air sensitivity, and are readily solution processable.

According to one aspect, A polymer comprising a structure represented by formula 1:

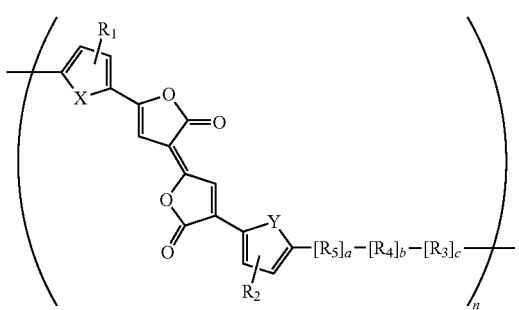

formula 1 wherein X and Y are independently selected from O, S, or Se; $R_5$ and $R_3$ is an aryl group containing from about 2 to about 36 carbon atoms, or a heteroaryl group containing from about 2 to about 30 carbon atoms and may be optionally substituted; $R_4$ is an alkene, alkyne, or an aryl group containing from about 2 to about 36 carbon atoms, or a heteroaryl group containing from about 2 to about 30 carbon atoms and may be optionally substituted; $R_1$ and $R_2$ may be the same or different, and are selected from the group comprising a hydrogen, an alkyl group (linear or branched), a substituted alkyl group, an alkoxy group, an alkylthio group, an aryl group, a substituted aryl group; a, b, and c are independently integers from 0 to 5; and n is the number of repeat units from about 2 to about 5000 is provided.

According to another aspect, A film forming semiconductor composition comprising a solvent; and a polymer of formula 1:

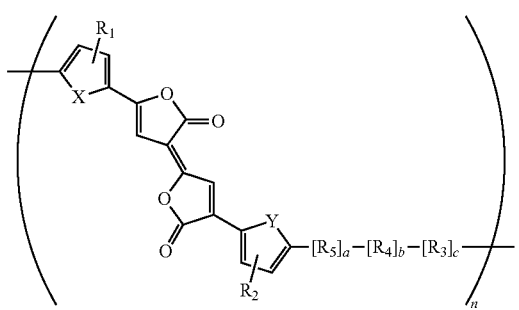

formula 1 wherein X and Y are independently selected from O, S, or Se; $R_5$ and $R_3$ is an aryl group containing from about 2 to about 36 carbon atoms, or a heteroaryl group containing from about 2 to about 30 carbon atoms and may be optionally substituted; $R_4$ is an alkene, alkyne, or an aryl group containing from about 2 to about 36 carbon atoms, or a heteroaryl group containing from about 2 to about 30 carbon atoms and may be optionally substituted; $R_1$ and $R_2$ may be the same or different, and are selected from the group comprising a hydrogen, an alkyl group (linear or branched), a substituted alkyl group, an alkoxy group, an alkylthio group, an aryl group, a substituted aryl group; a, b, and c are independently integers from 0 to 5; and n is the number of repeat units from about 2 to about 5000 is provided.

According to yet another aspect of this disclosure, an electronic device comprising the polymer of formula 1:

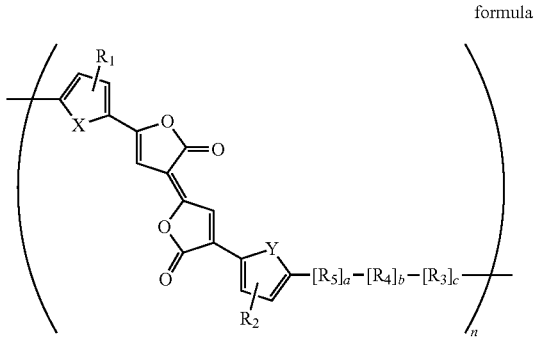

formula 1 wherein X and Y are independently selected from O, S, or Se; $R_5$ and $R_3$ is an aryl group containing from about 2 to about 36 carbon atoms, or a heteroaryl group containing from about 2 to about 30 carbon atoms and may be optionally substituted; $R_4$ is an alkene, alkyne, or an aryl group containing from about 2 to about 36 carbon atoms, or a heteroaryl group containing from about 2 to about 30 carbon atoms and may be optionally substituted; $R_1$ and $R_2$ may be the same or different, and are selected from the group comprising a hydrogen, an alkyl group (linear or branched), a substituted alkyl group, an alkoxy group, an alkylthio group, an aryl group, a substituted aryl group; a, b, and c are independently integers from 0 to 5; and n is the number of repeat units from about 2 to about 5000 is provided.

DETAILED DESCRIPTION

Figure 1:
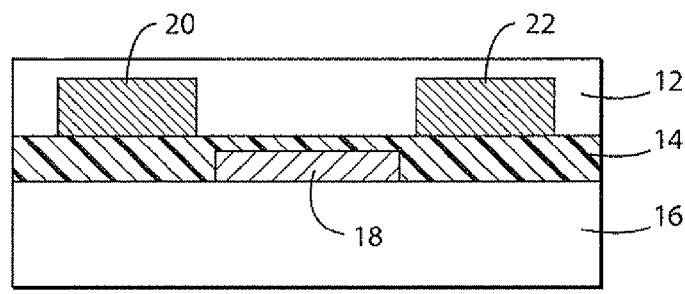
FIG. 1 is a cross sectional view of an exemplary embodiment of an OTFT wherein the semiconducting material comprises the disclosed Pechmann dye based polymers.

The present disclosure provides new Pechmann dye based polymers, prospective methods for creating the Pechmann dye based polymers, incorporation of the polymers into new film forming semiconductor compositions, and incorporation of the semiconductor compositions into OTFTs.

Polymer

The present disclosure provides an Pechmann dye polymer of formula 1:

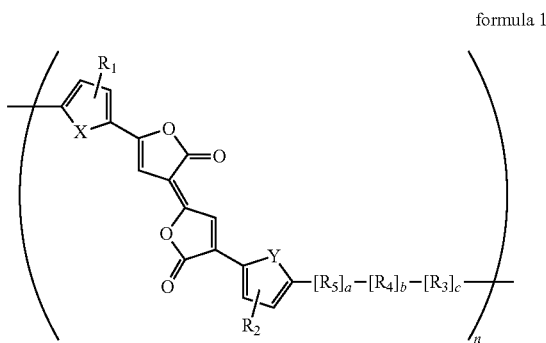

formula 1 wherein X and Y are independently selected from O, S, or Se;

$R_5$ and $R_3$ is an aryl group containing from about 2 to about 36 carbon atoms, or a heteroaryl group containing from about 2 to about 30 carbon atoms and may be optionally substituted;

$R_4$ is an alkene, alkyne, or an aryl group containing from about 2 to about 36 carbon atoms, or a heteroaryl group containing from about 2 to about 30 carbon atoms and may be optionally substituted;

$R_1$ and $R_2$ may be the same or different, and are selected from the group comprising a hydrogen, an alkyl group (linear or branched), a substituted alkyl group, an alkoxy group, an alkylthio group, an aryl group, a substituted aryl group;

a, b, and c are independently integers from 0 to 5;

and n is the number of repeat units and may be from about 2 to about 5,000.

As used herein, the modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The alkyl radical may be linear, branched, or cyclic. The alkyl radical may be univalent or divalent, i.e., can bond to one or two different non-hydrogen atoms. Generally, the alkyl groups independently contain from about 1 to about 50 carbon atoms, such as from about 2 to about 24 atoms, or from about 3 to about 10 atoms.

The alkyl groups can include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, and isomers thereof (can we include some branched alkyl groups as well 2-ethylhexyl, 2-hexyldecyl, 2-octyldodecyl and 2-decyltetradecyl). The alkyl group may be optionally substituted one or more times with, for example, a halogen, such as chlorine, bromine, fluorine, or iodine, or a heteroatom-containing group, or a mixture thereof. Suitable heteroatom-containing groups include a nitrogen containing moiety, an alkoxy group, a heterocyclic system, an alkoxyaryl, an arylalkoxy, cyano group, nitro group, methoxyl group, ethoxyl group, and propoxyl group. The heteroatom containing groups may have from about 2 to about 50 atoms, such as from about 3 to about 25 atoms, or from about 4 to about 15 atoms. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl group may also be substituted with an aryl or heteroaryl group.

The aryl groups independently contain from about 6 to about 30 carbon atoms, such as from about 8 to about 10 atoms, or from about 10 to about 20 atoms. The heteroaryl groups contain from about 2 to about 50 carbon atoms, such as from about 3 to about 20 atoms, or from about 6 to about 10 atoms.

When aryl is described in connection with a numerical range of carbon atoms, it should not be construed as including the carbon atoms in substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as counting the carbon atoms in the substituted group of a methylphenyl group (e.g., 1 carbon atom from the methyl group). The aryl radical may be univalent or divalent.

Suitable aryl and substituted aryl groups include phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, other aryl groups listed as exemplary groups below, and combinations thereof.

An aryl or a heteroaryl group may also be substituted with alkyl or alkoxy. Exemplary substituted aryl groups include methylphenyl and methoxyphenyl. Exemplary substituted heteroaryl groups include 3-methylthienyl.

Heteroaryl can include heterocycles that include an unsaturated ring comprising at least two carbon atoms and at least one atom which is a different atom from carbon, such as S, Se, Si, O, or N. The heteroaryl group may have, for example, about 3 to about 80 atoms, such as from about 4 to about 20 atoms, or from about 4 to about 10 atoms. The heteroaryl group may be an electron-donating group, which assists in hole transport. The heteroaryl group may be an electron-withdrawing group, which assists in electron transport.

The heteroaryl group may include a five-membered unsaturated ring comprising a single heteroatom, such as S, Si, Se, O, or N. Suitable heteroaryl groups include furan, thiophene, selenophene, oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, thienothiophene, dithienothiophene, imidazothiazole, benzofuran, benzodifuran, benzothiophene, benzodithiophene, benzoxazole, benzthiazole, benzthiadiazole, benzimidazole, imidazopyridine, pyrrolopyridine, pyrrolopyrimidine, pyridopyrimidine, and combinations thereof.

The number of repeat units, n, may be from about 2 to about 5,000, or more particularly about 10 to 4,000, about 100 to about 3,500, about 500 to 3,000, or 1,000 to about 2,500; and a, b, or c, can independently be an integer from 0 to 5, or more particularly, in some embodiments, a non-zero integer, 2, or 3.

In some embodiments of the polymer of formula 1, $R_3$, and $R_5$ can be independently selected from the group consisting of the following structures or optionally substituted structures (3) through (38) and (40) through (41), and $R_4$ is independently selected from the group consisting of the following structures, (1) through (41):

(1)

(2)

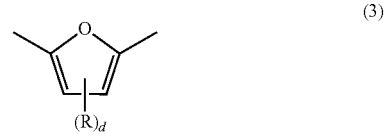

(3)

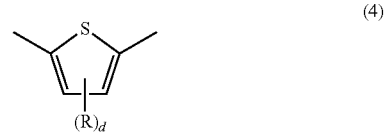

(4)

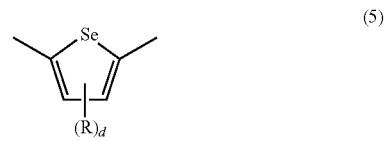

(5)

(6)

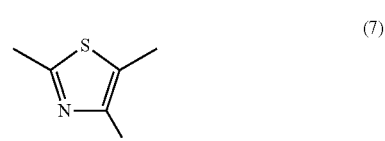

(7)

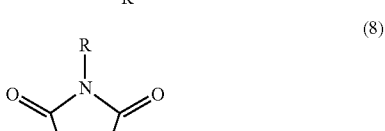

(8)

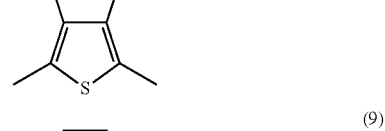

(9)

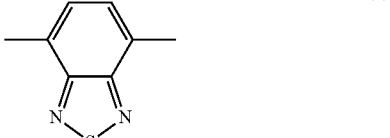

(10)

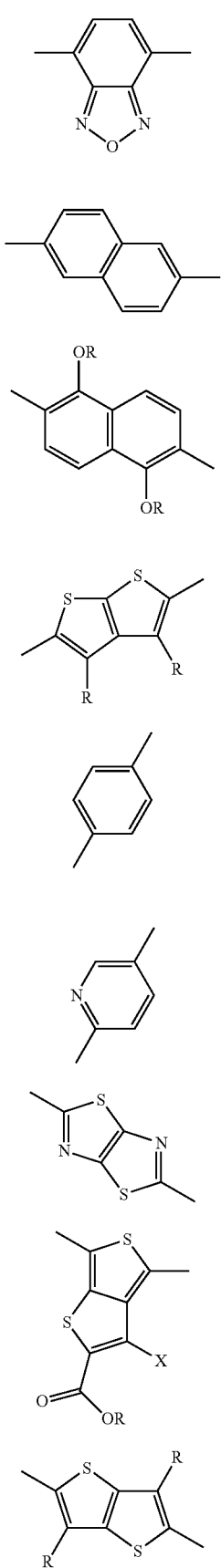

(29) 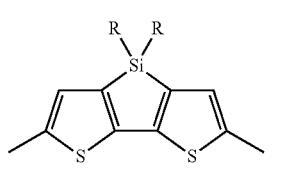
(30) 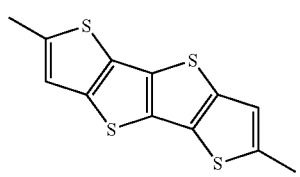
(31) 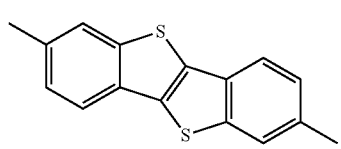
(32) 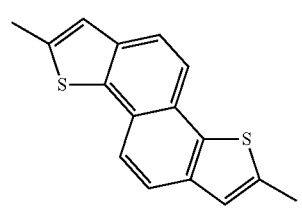
(33) 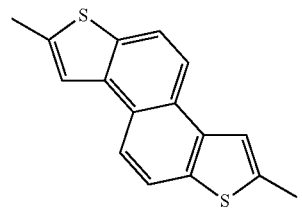
(34) 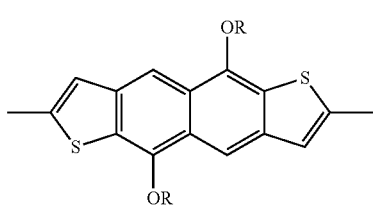
(35) 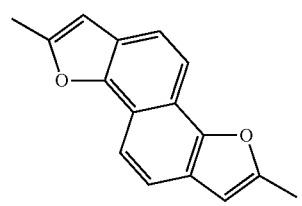
(36) 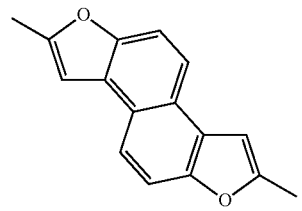
(37) 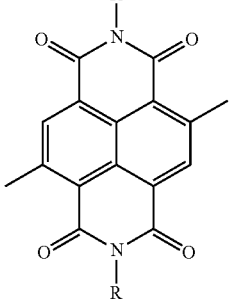
(38) 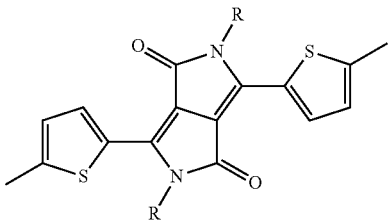
(39) 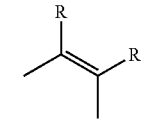
(40) 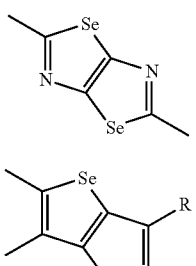
(41) 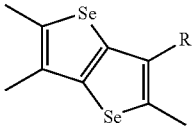
where R is independently selected from hydrogen, alkyl (linear or branched), substituted alkyl, alkoxy, alkylthio, aryl, substituted aryl, heteroaryl, substituted heteroaryl, X is H, F, or Cl; and d is 1 or 2.
Specific examples of the Pechmann dye based polymers of formula 1 can include the following polymers (42)-(73):
(42) 

(43)
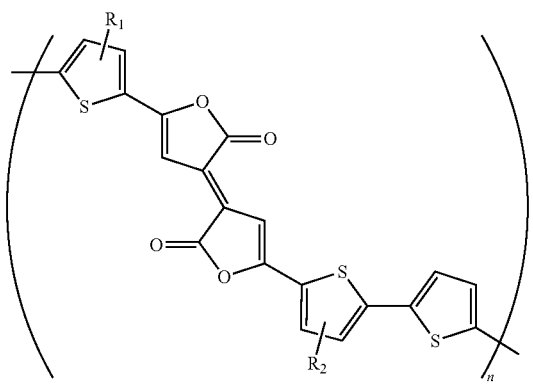
(44)
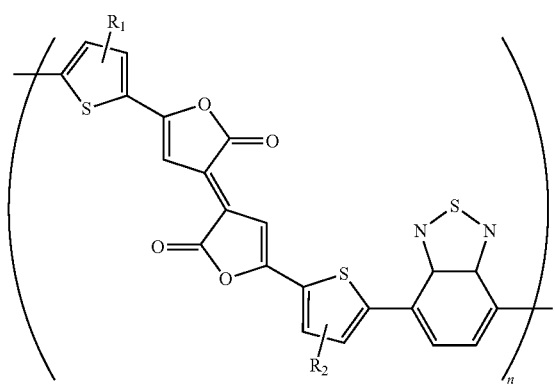
(45)
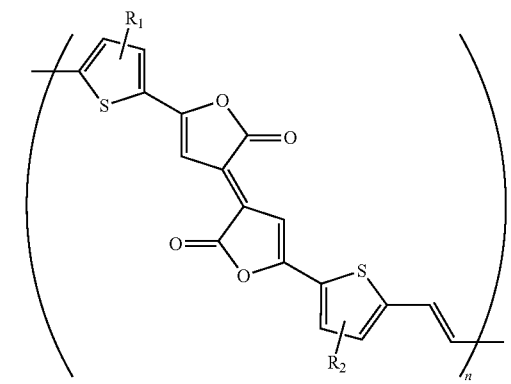
(46)
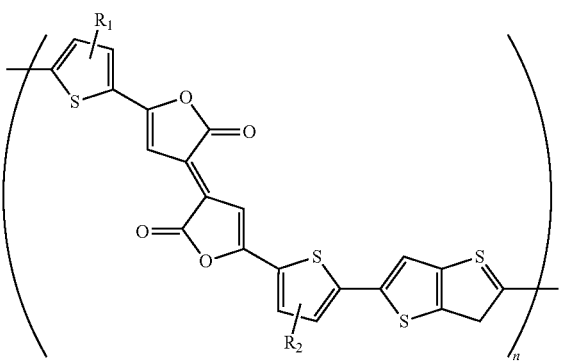
(47)
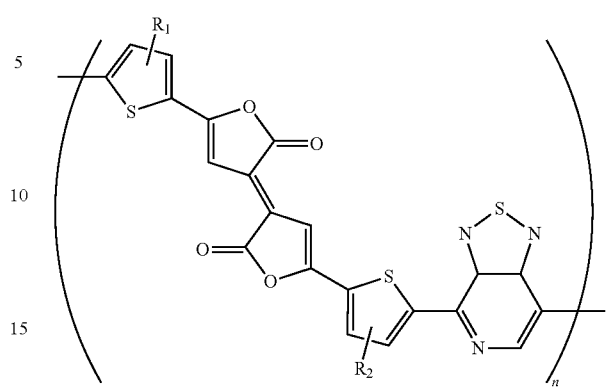
(48)
(49)
(50)
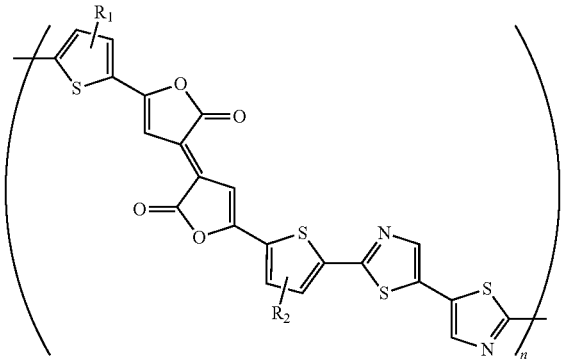

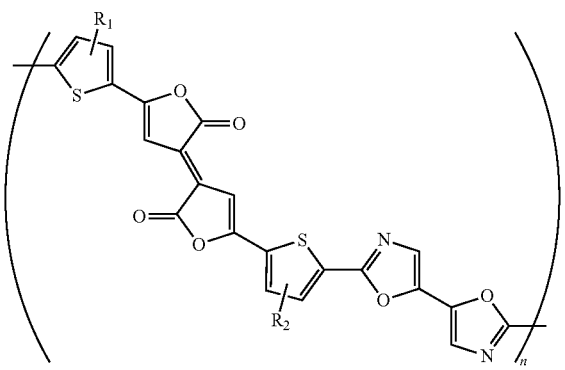
(51)
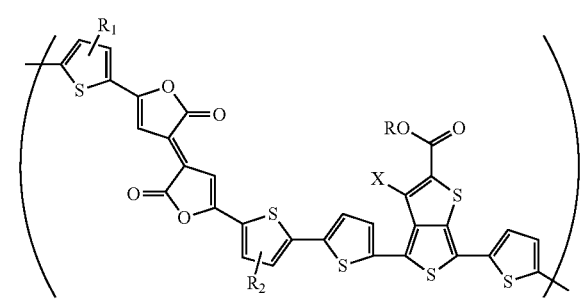
(55)
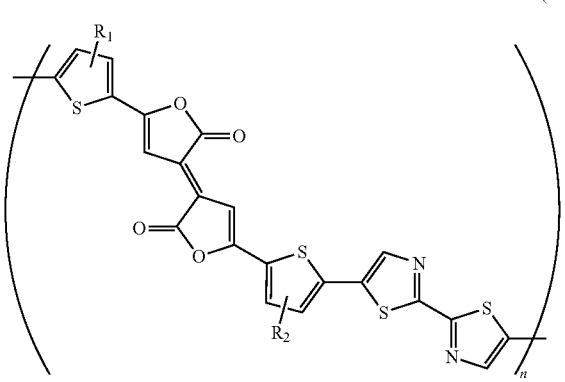
(52)
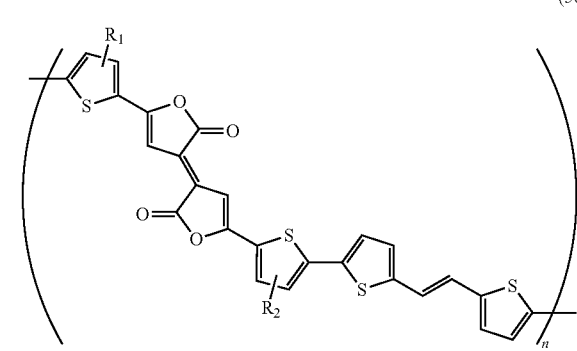
(56)
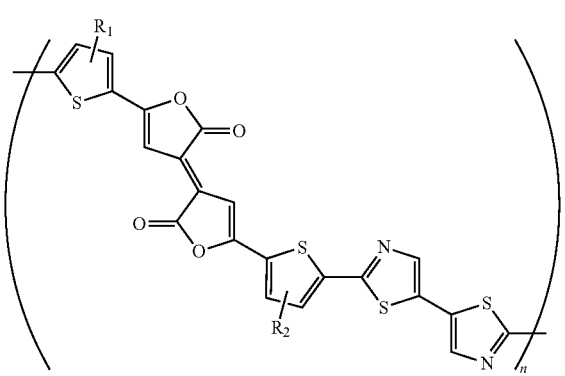
(53)
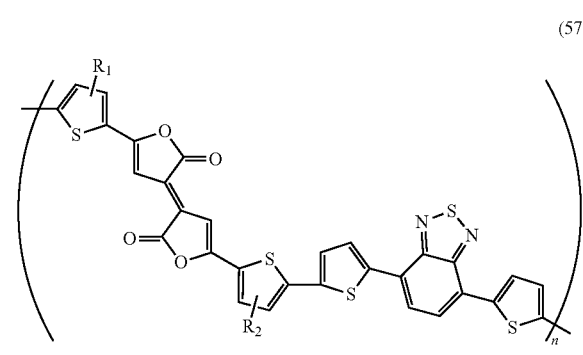
(57)
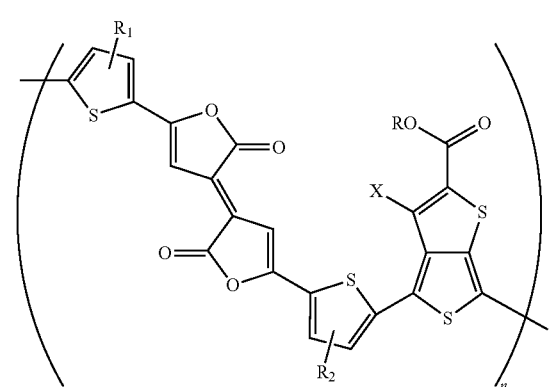
(54)
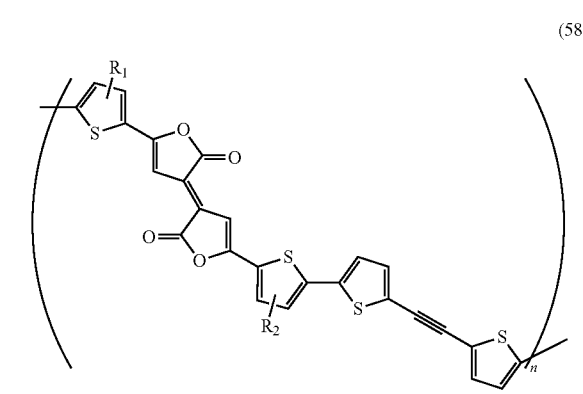
(58)

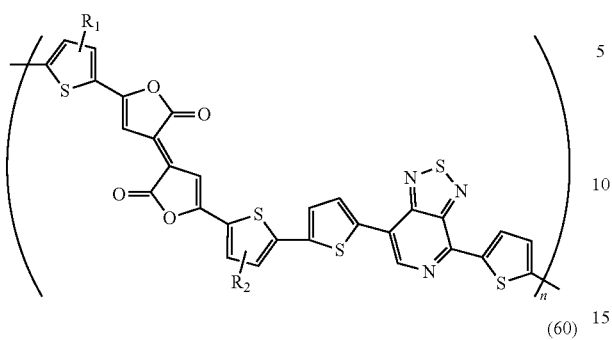
(59)
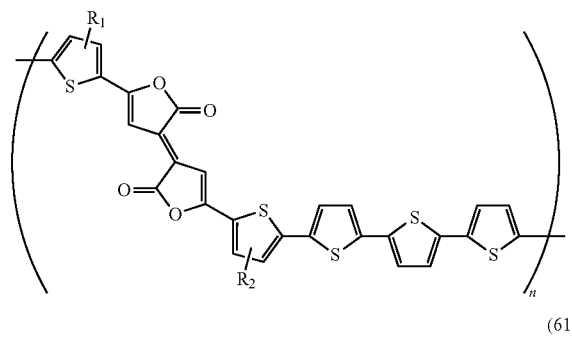
(60)
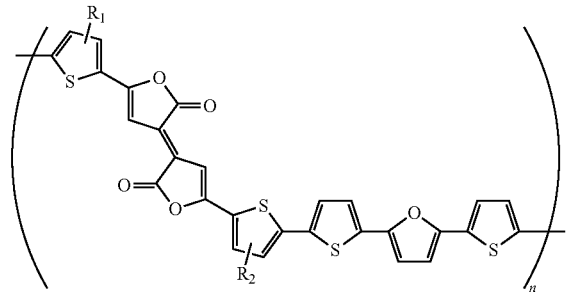
(61)
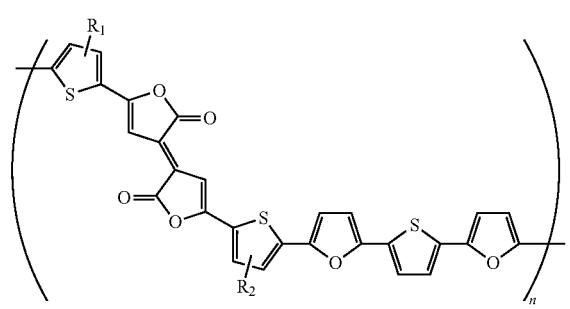
(62)
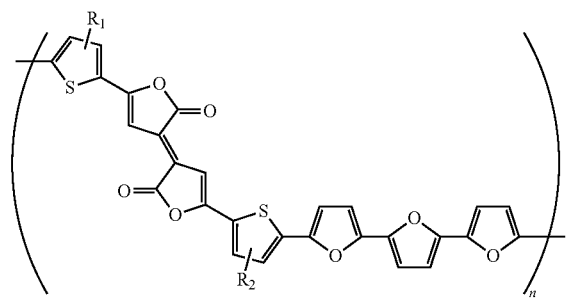
(63)
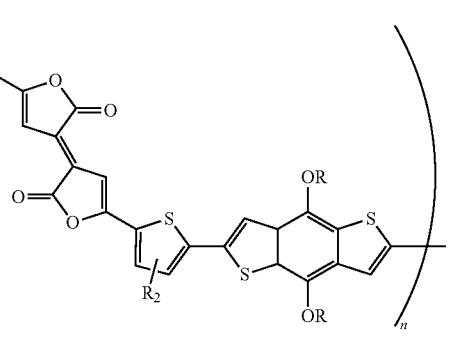
(64)
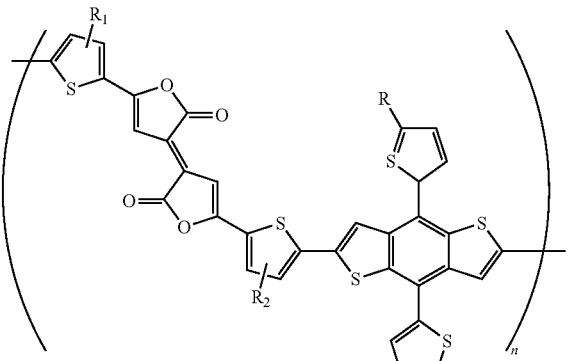
(65)
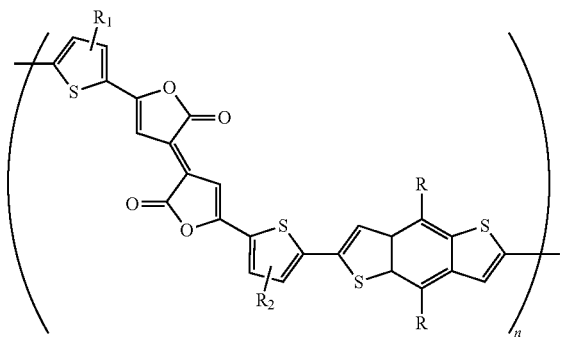
(66)
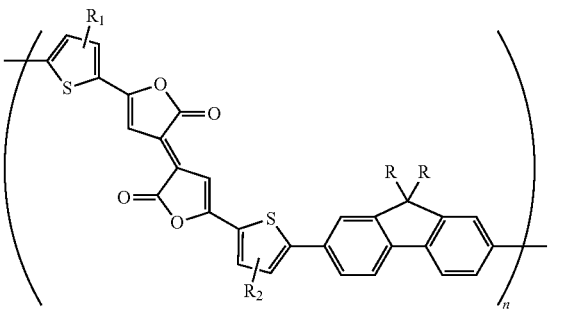
(67)

(68)

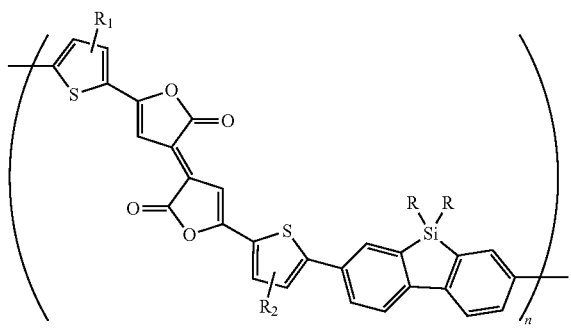

(72)

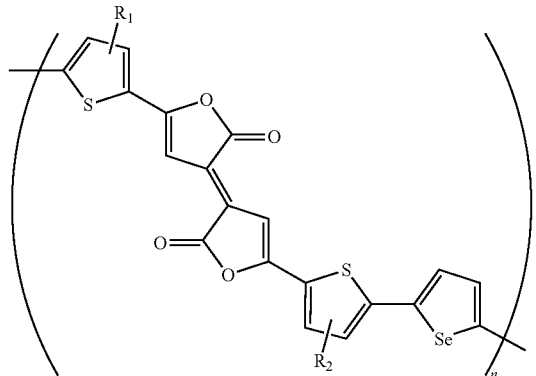

(69)

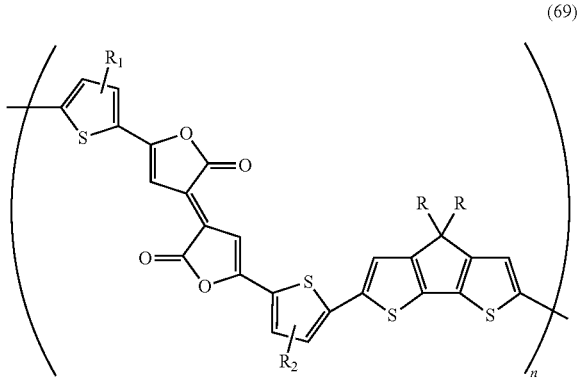

(73)

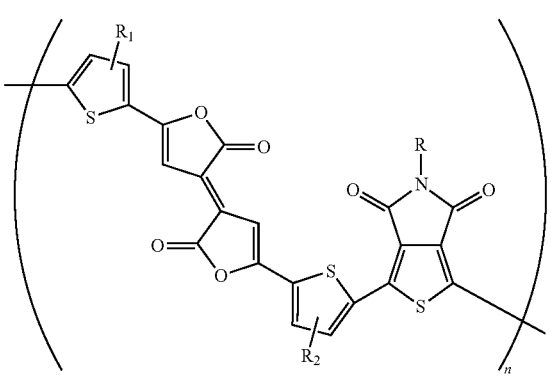

(70)

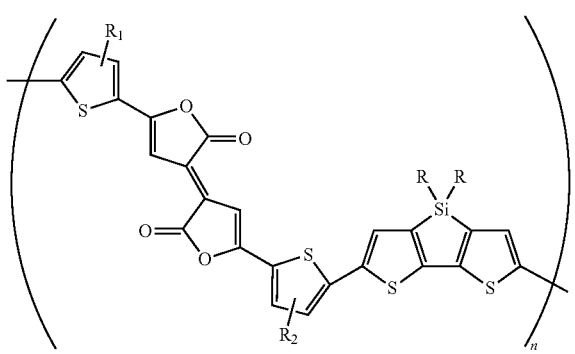

(71)

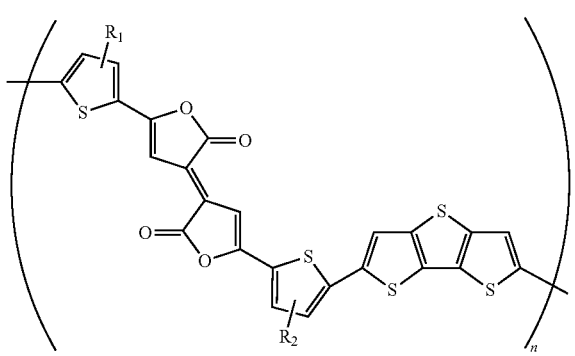

where R is independently selected from hydrogen, alkyl (linear or branched), substituted alkyl, alkoxy, alkylthio, aryl, substituted aryl, heteroaryl, and substituted heteroaryl groups, X is H, F, or Cl, and $R_1$ and $R_2$ are as defined above.

The disclosed polymers potentially offer solution processability in solvents which can dissolve the polymer for subsequent film formations as discussed in further detail below.

Although the solubility of various polymers will vary, long branched alkyl side chains can be used to improve the solubility of the resulting polymer. Moreover, the long branched alkyl side chains can prevent the interference of the side chain crystallization with the desirable main chain packing.

It is believed that the structure of the disclosed Pechmann dye based polymers can further allow for increased air-stability and have improved field-effect mobility. Moreover, the electron-withdrawing nature of this structure, due to the Pechmann dye containing units, is provided with improved air-stability and enhanced field-effect mobility. Additionally, these (co)polymers have excellent stability in ambient conditions because of their low-lying HOMO levels. The HOMOs are delocalized along the polymer chains, while the LUMOs are mostly localized along the Pechmann Dye.

Because structure of one of the various disclosed Pechmann dye based polymers may be chosen due to various requirements (e.g. field-effect mobility and solubility), the method of production of the polymeric compounds may also vary. Disclosed herein are prospective synthesis mechanisms for Pechmann dye based polymers.

Prospective Synthesis of Pechmann Dye Based Polymers

Scheme 1 and Scheme 2 (shown below) exemplify proposed chemical synthesis procedures for the disclosed Pechmann dye based polymers.

The proposed synthesis of the Pechmann dye based polymers can be accomplished by using reactants with thiophene-containing derivatives. Some thiophene-containing Pechmann dye derivatives have been disclosed in recent literature. For example, T. Norsten et al. *Org. Lett.* 2010, 12, 4, 816, which is herein incorporated by reference in its entirety, discloses thiophene-containing Pechmann dye derivative 3 (shown below), (unsaturated exo-5,5-dilactones) prepared by Cu-catalyzed dehydration of β-aroylacrylic acids. It is believed that various thiophene-containing Pechmann dye derivatives can undergo polymerization according to Scheme 1 or Scheme 2.

Scheme 1

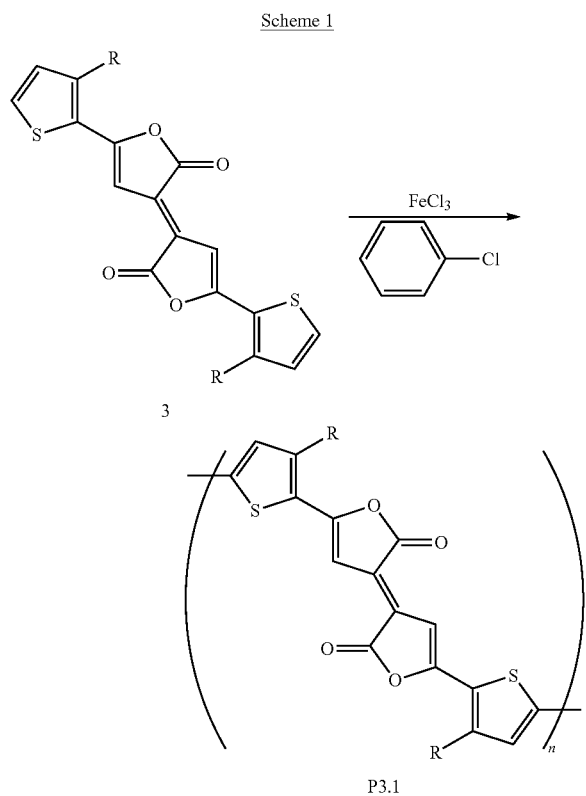

According to exemplary Scheme 1, synthesis of the polymer P3.1 can be achieved by starting from thiophene-containing Pechmann dye derivative 3 using an oxidative polymerization in the presence of a catalyst (e.g., FeCl₃).

Scheme 2

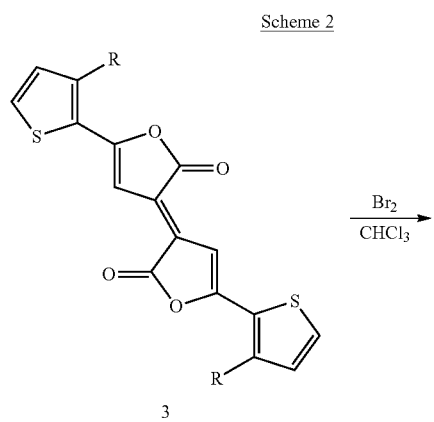

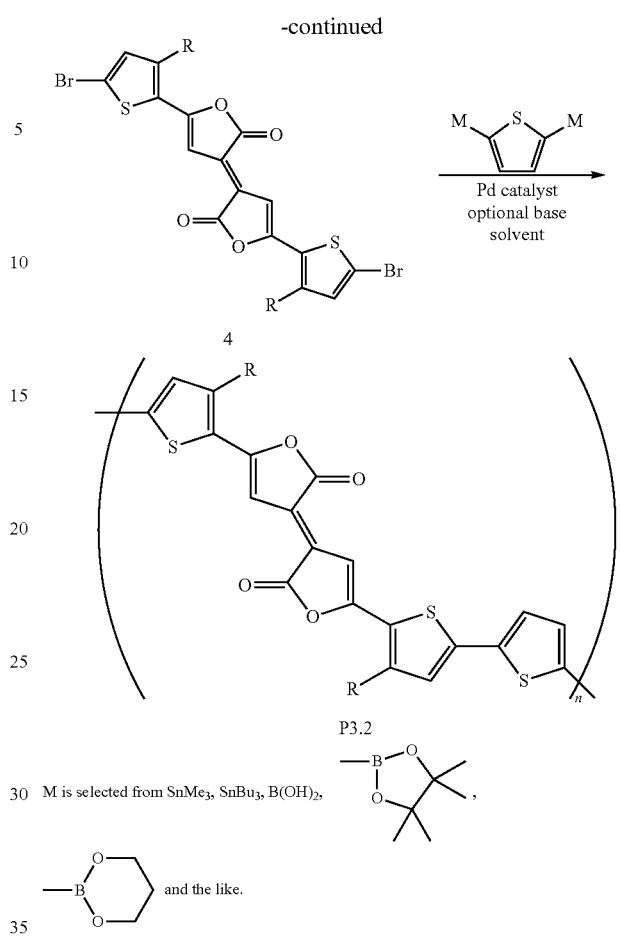

M is selected from SnMe₃, SnBu₃, B(OH)₂,

Alternatively, exemplary Scheme 2 shows how the thiophene-containing Pechmann dye derivative 3 can be brominated using molecular bromine to form dibromo compound 4. Some copolymers disclosed in this invention can then be prepared using a palladium catalyzed polycondensation reaction of a bifunctional organotin or organoboron reagent with dibromo compound 4, resulting in the exemplary synthesis of P3.2.

Scheme 2 may be performed in solution using a catalyst suitable for coupling reactions or for polycondensation reactions, optionally in the presence of copper(I) iodide. A suitable coupling catalyst is a palladium-based catalyst, e.g., a tetrakis(triarylphosphonium)-palladium catalyst, such as tetrakis(triphenylphosphine)palladium(0) (Pd(PPh₃)₄), Pd(PPh₃)₂Cl₂, PdOAc₂, Pd(dba)₃:P(o-Tol)₃, or derivatives thereof. Usually, the catalyst is added in a molar ratio of compound C to the catalyst in the range of from about 1000:1 to about 10:1, e.g., from about 100:1 to about 30:1. A suitable solvent for the reaction may be tetrahydrofuran (THF), dioxane, 1-methyl-2-pyrrolidinone (NMP), dimethylacetamide (DMA), dimethylformamide (DMF), toluene, xylenes, water, or mixtures thereof. For suitable solvent mixtures containing water, an optional phase transfer catalyst may be added. The reaction may be carried out under reflux at a temperature which is at or slightly above the boiling point of the solvent.

The comonomer shown here as compound C generally has the formula M-G-M, where G is the conjugated moiety and M is a reactive group that depends on the polycondensation reaction. For example, in a Suzuki reaction, the reactive group M may be one of those shown below:

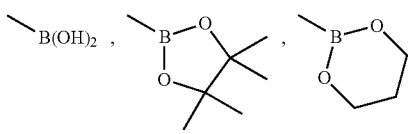

An additional base, such as $K_2CO_3$, $Cs_2CO_3$, $K_3PO_4$, KF, or CsF, may also be required for a Suzuki reaction. Alternatively, in a Stille reaction, the reactive group M is a trialkylstannyl group such as —$SnMe_3$ or —$Sn(n-Bu)_3$.

The copolymers thus formed may have a weight average molecular weight Mw in the range of from about 700 to about 1,000,000. In some embodiments, the copolymer of formula (I) has a Mw of about 1,000 to about 800,000, including from about 5,000 to about 100,000.

The copolymers thus formed may have a polydispersity index (PDI) in the range of from about 2 to about 10. In some embodiments the copolymer of formula (I) has a PDI of about 2 to about 5, including from about 2 to about 3.

Film Forming Semiconductor Polymer Composition

The present disclosure also includes incorporation of the aforementioned Pechmann dye based polymers in a semiconductor composition. As discussed below, it is believed that a semiconductor formed from the film forming semiconductor composition has high mobility (>0.1 $cm^2V^{-1}s^{-1}$) and a high on/off ratio (>$10^6$).

Moreover, the highly conjugated Pechmann dye based polymers may provide for a p-type semiconductor material. The electron-withdrawing-nature of the disclosed Pechmann dye based polymers, due to the Pechmann dye units, may provide improved air-stability and enhanced field-effect mobility. Based on molecular modeling studies the band-gap of the polymers is expected to in the range of 1.3-2.5 eV. The HOMO energy levels indicate that the polymers will have good air stability.

The Pechmann dye based polymers are believed to be soluble or substantially soluble in common coating solvents. Thus, the Pechmann dye based polymers may form a semiconductor solution comprising a Pechmann dye based polymer of formula 1 in an organic solvent.

Thus, the present disclosure also provides a film forming semiconductor composition comprising:
at least one solvent; and
at least one Pechmann dye based polymer represented by the structure of formula 1, above.

The semiconductor composition can then be used to create a semiconductor layer of an electronic device, such as a TFT, using low-cost solution-based patterning and deposition techniques, such as spin coating, solution casting, dip coating, stencil/screen printing, flexography, gravure, offset printing, ink jet-printing, micro-contact printing, and the like. The semiconductor composition may be soluble or substantially soluble in common coating solvents and thus may form a semiconductor comprised of the material in an organic solvent.

Prospective exemplary suitable processing solvents include aromatic hydrocarbon solvents (toluene, xylenes, anisole, tetrahydronaphthalene, chlorobenzene, o-dichlorobenzene and the like), hydrocarbon solvents (heptanes, terpineol, isopar and the like), chlorinated aliphatic solvents (chlorobutane, dichloroethane, chloroform, trichloroethane, tetrachloroethane and the like), ethers (tertbutylmethylether, diphenyl ether, dibutylether and the like), ketones (methylisobutyl ketone, cyclohexanone, cyclopentanone and the like), esters (n-butylacetate, isopropylacetate and the like), aprotic solvents (e.g., THF), and mixtures thereof. More particularly, the solvent can also be either dioxane, THF, or DMF.

The solvent may be present in a film forming semiconductor solution, for the formation of a semiconductor composition, in an amount of from about 0.1 to about 2 wt. %, from about 0.2 to about 1 wt. %, and from about 0.3 to about 0.6 wt. %, based upon the weight of the semiconductor solution. The polymer may be present in the film forming composition in an amount of from about 0.1 to about 2 wt. %, from about 0.5 to about 2 wt. %, and from about 1 to about 1.5 wt. %, based upon the weight of the solution.

The Pechmann dye based semiconductor film forming composition may also comprise additional compounds, such as other copolymers, binders, solvents, dopants, and the like.

The present disclosure also provides a film forming semiconductor composition comprising a Pechmann dye polymer and in some additional embodiments, the semiconductor compositions may additionally include carbon nanotubes as disclosed in application Ser. No. 13/706,836, filed on Dec. 6, 2012, entitled Semiconductor Composites Comprising CARBON NANOTUBES AND DIKETOPYRROLOPYRROLE-THIOPENE BASED COPOLYMERS, by Yiliang Wu, et al. which is herein incorporated entirely by reference, discloses semiconductor compositions comprising a carbon nanotube (CNT) dispersed in a copolymer of diketopyrrolopyrrole (DKPP) and thiophene. Dispersing CNTs into the copolymer can increase the mobility and mechanical strength of a semiconductor material containing the semiconductor composition. Additionally, a device containing the semiconductor composition with carbon nanotubes dispersed in a copolymer can have enhanced electrical performance.

The present disclosure also provides for, in some embodiments, a semiconductor composition comprising an Pechmann dye based polymer and, in some embodiments, a fullerene and/or a substituted fullerene derivative such as phenyl-C61-butyricacid-methylester (PCBM). Some example of fullerenes can include spheroidal carbon compounds having five-membered or six-membered rings (e.g., C60, C70, or C844, and may also have additional carbon atoms added through derivative groups).

Thin Film Transistors

The present disclosure also includes a thin film transistor comprising:
a source and a drain;
a gate; and
a semiconductor film layer positioned between the source and the drain, where the semiconductor film includes the at least one polymer of formula 1.

Figure 2:
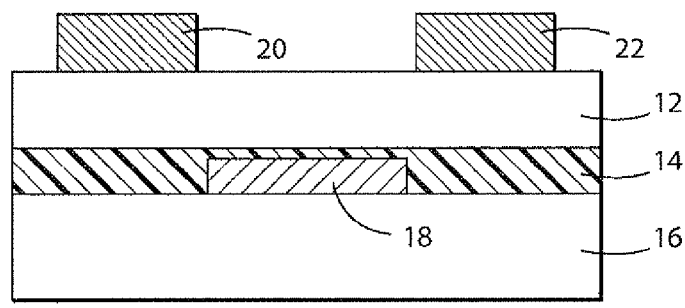
FIG. 2 is a cross sectional view of an additional exemplary embodiment of an OTFT wherein the semiconducting material comprises the disclosed Pechmann dye based polymers.

FIG. 1 and FIG. 2 are cross sectional views of TFTs. The semiconducting layer (12) of FIG. 1 and FIG. 2 (described below) can be formed from the Pechmann dye based semiconductor film forming composition and may also comprise additional compounds, such as other copolymers, binders, solvents, dopants, and the like.

FIG. 1 illustrates an OTFT configuration comprised of a substrate (16) in contact with a gate electrode (18) and with a gate dielectric layer (14) containing the gate electrode (18). The source electrode (20) and the drain electrode (22) are produced on top of the gate dielectric layer (14). Above and situated between the source electrode (20) and the drain electrode (22) is the polymeric semiconductor layer (12) formed from the Pechmann dye based film forming composition.

The various components of the OTFT may be deposited upon the substrate in any order. The gate electrode and the semiconducting layer can both be in contact with the gate dielectric layer. In addition, the source and drain electrodes can both be in contact with the semiconducting layer. The phrase "in any order" includes sequential and simultaneous formation. For example, the source electrode and the drain electrode can be formed simultaneously or sequentially. The term on or upon the substrate refers to the various layers and components with reference to the substrate as being the bottom or support for the layers and components that are on top of it. In other words, all of the components are on the substrate, even though they do not all directly contact the substrate. For example, both the dielectric layer and the semiconductor layer are considered to be "on" the substrate, even though one layer is closer to the substrate than the other layer.

FIG. 2 illustrates an OTFT configuration of another embodiment that includes a substrate (16) in contact with a gate electrode (18) and with a gate dielectric layer (14) containing the gate electrode (18). On top of the gate dielectric layer (14) the polymeric semiconductor layer (12) containing the Pechmann dye based polymer of formula 1 is deposited. Above the polymeric semiconductor layer (12) are the source electrode (20) and the drain electrode (22).

The substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to about 100 millimeters with a specific thickness being from about 50 to about 100 micrometers, especially for a flexible plastic substrate, and from about 1 to about 10 millimeters for a rigid substrate such as glass or silicon.

The gate dielectric layer, which can separate the gate electrode from the source and drain electrodes, and in contact with the semiconductor layer, can generally be an inorganic material film, an organic polymer film, or an organic-inorganic composite film. The thickness of the gate dielectric layer can be, for example, from about 10 nanometers to about 1 micrometer with a more specific thickness being about 100 nanometers to about 500 nanometers. Examples of inorganic materials suitable as the dielectric layer may include silicon oxide, silicon nitride, aluminum oxide, barium titanate, barium zirconate titanate and the like. Examples of organic polymers for the dielectric layer may include polyesters, polycarbonates, poly(vinyl phenol), polyimides, polystyrene, poly(methacrylate)s, poly(acrylate)s, epoxy resin and the like. Examples of inorganic-organic composite materials may include nanosized metal oxide particles dispersed in polymers, such as polyester, polyimide, epoxy resin and the like. The gate dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

The dielectric layer may be surface modified with a surface modifier. Exemplary dielectric modifiers include organosilanes, such as hexamethyldisilazane (HMDS), phenyltrichlorosilane, octyltrichlorosilane (OTS-8), and octadecyltrichlorosilane (ODTS-18). The semiconducting layer can be directly contacted with this modified dielectric layer surface. The contact may be complete or partial. This surface modification can also be considered as forming an interfacial layer between the dielectric layer and the semiconducting layer.

Situated, for example, between (and in some embodiments, in contact with) the dielectric layer and the source/drain electrodes is the active semiconductor layer formed from the semiconductor composition of the embodiments disclosed herein. When referring to the relative position of the source electrode, the drain electrode, and the semiconductor layer, the term "between" encompasses any position of the semiconductor layer that would allow for the flow of electrons between the source electrode and the drain electrode through the semiconductor layer. The thickness of this layer is generally, for example, about 5 nanometers to about 1 micrometer, about 5 nanometers to about 500 nanometers or about 20 nanometers to about 100 nanometers. This layer can generally be fabricated by solution processes such as spin coating, casting, screen, stamp, or jet printing of a solution of polymeric semiconductors of the present disclosure. In certain configurations, the semiconducting layer completely covers the source and drain electrodes.

The gate electrode can be a thin metal film, a conducting polymer film, a conducting film generated from a conducting ink or paste, or the substrate itself (for example heavily doped silicon). Examples of the gate electrode materials may include gold, silver, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG® available from Acheson Colloids Company, and silver filled electrically conductive thermoplastic ink available from Noelle Industries, and the like. The gate layer may be prepared by vacuum evaporation, sputtering of metals or conductive metal oxides, coating from conducting polymer solutions or conducting inks, or dispersions by spin coating, casting or printing. The thickness of the gate electrode layer may be, for example, from about 10 nanometers to about 10 micrometers, and a specific thickness may be, for example, from about 10 to about 200 nanometers for metal films and about 1 to about 10 micrometers.

The source and drain electrode layer can be fabricated from materials which provide a low resistance ohmic contact to the semiconductor layer. Typical materials suitable for use as source and drain electrodes may include those of the gate electrode materials such as gold, nickel, aluminum, platinum, conducting polymers, and conducting inks. Typical thickness of this layer may be, for example, from about 40 nanometers to about 1 micrometer with the more specific thickness being about 100 to about 400 nanometers.

The TFT devices may contain a semiconductor channel with a width (being the distance between the source and drain) and a length (the distance along the axis perpendicular to the viewing plane of FIG. 1 and FIG. 2). The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volts to about −80 volts is applied to the drain electrode to collect the charge carriers transported across the semiconductor channel when a voltage of generally, for example, about +10 volts to about −80 volts is applied to the gate electrode.

Specific individual characteristics of the disclosed polymers, semiconductors, and thin film transistors will have varying properties because of polymer or solvent selection. In some embodiments, a semiconductor incorporating some of the disclosed polymers with an OTFT device may generally exhibit a field-effect mobility range from about 0.001 to about 10 cm$^2$/(V·sec), from about 0.01 to about 10 cm$^2$/(V·sec) and from about 0.1 to about 5 cm$^2$/(V·sec). Similarly, the on/off ratio can also vary and is typically, the on/off ratio is at least $10^4$, or more specifically between about $10^5$ and $10^8$ or between about $10^6$ and $10^7$.

The semiconducting layer may be formed in an electronic device using the film forming semiconductor composition and can be carried out by depositing the semiconductor solution on a substrate using any suitable liquid deposition technique at any suitable time prior to or subsequent to the formation of other optional layer or layers on the substrate. Thus, liquid deposition of the semiconductor solution on the substrate can occur either on a substrate or on a substrate already containing layered material, for example, a semiconductor layer and/or an insulating layer of a thin-film transistor.

The phrase liquid deposition technique includes, for example, deposition of a composition using a liquid process such as liquid coating or printing technique, where the liquid is a homogeneous or heterogeneous dispersion of the Pechmann dye based semiconductor composition in a solvent. Furthermore, the semiconductor solution may be deposited in any suitable pattern on the substrate.

Examples of liquid coating processes may include, for example, spin coating, blade coating, rod coating, dip coating, and the like. Examples of printing techniques may include, for example, lithography or offset printing, gravure, flexography, screen printing, stencil printing, inkjet printing, stamping (such as microcontact printing), and the like. In embodiments, liquid deposition of the semiconductor solution deposits a layer of the polymeric semiconductor having a thickness ranging from about 5 nanometers to about 1 micrometer, about 5 nanometers to about 500 nanometers or about 20 nanometers to about 100 nanometers.

The film forming semiconductor composition may be heated when forming a TFT. The film forming semiconductor composition may be heated at a temperature range from about 50° C. to about 300° C., or from about 80° C. to about 150° C., to remove the solvent from the semiconductor solution and thus form a layer comprising the Pechmann dye based semiconductor composition on the substrate. The heating temperature should be selected as to not cause adverse changes in the properties of previously deposited layer(s) or the substrate (whether single layer substrate or multilayer substrate) and the heating temperature is related to the temperature following deposition.

The heating can be performed for a time ranging, for example, from 1 second to about 5 hours and from about 10 min to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 milibars to about 0.01 milibars.

As used herein, the term heating also encompasses any technique(s) that can impart sufficient energy to remove the solvent from the substrate. Examples of heating techniques may include thermal heating (for example, a hot plate, an oven, and a burner), infra-red ("IR") radiation, a laser beam, microwave radiation, or UV radiation, or a combination thereof.

Other known suitable materials not recited herein for the various components of the TFT devices of the present disclosure can also be selected in various electronic devices.

The present disclosure additionally provides an electronic device comprising the Pechmann dye polymers. The Pechmann dye based semiconductor composition may be used in electronic devices, such as organic electronic devices, thin-film transistors, diodes and photovoltaic devices, such as polymer solar cells (PSCs).

The photovoltaic devices can comprise photovoltaic cells having an active layer comprising the Pechmann dye based semiconductor composition or polymers of formula 1 and/or can also comprise thin film transistors having the Pechmann dye based semiconductor composition or polymers of formula 1. The semiconductor composition can additionally include dopants, carbon nanotubes, unsubstituted fullerenes, and substituted fullerene derivatives as described above when used in photovoltaic devices. It can be appreciated that one can engineer HOMO, LUMO, and band gaps for the Pechmann dye based semiconductor compositions to improve the performance of electronic devices comprising the Pechmann dye based semiconductor compositions.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A polymer comprising a structure represented by formula 1:

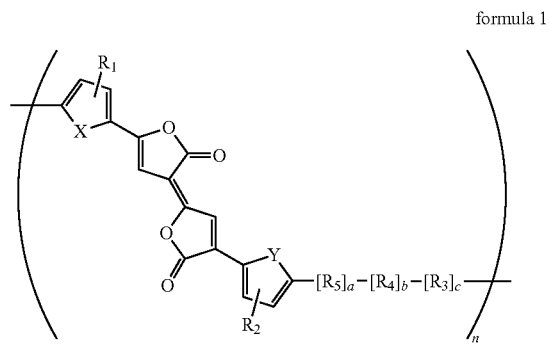

formula 1 wherein X and Y are independently selected from O, S, or Se;
$R_5$ and $R_3$ is an aryl group containing from about 2 to about 36 carbon atoms, or a heteroaryl group containing from about 2 to about 30 carbon atoms and may be optionally substituted;
$R_4$ is an alkene, alkyne, or an aryl group containing from about 2 to about 36 carbon atoms, or a heteroaryl group containing from about 2 to about 30 carbon atoms and may be optionally substituted;
$R_1$ and $R_2$ are the same or different, and are selected from the group comprising a hydrogen, an alkyl group (linear or branched), a substituted alkyl group, an alkoxy group, an alkylthio group, an aryl group, a substituted aryl group;
a, b, and c are independently integers from 0 to 5;
and n is the number of repeat units from about 2 to about 5000;
wherein $R_4$ is a substituted or unsubstituted alkene and b is 1 or 2.

2. The polymer according to claim 1 wherein:
at least one of a, b, and c is an integer from 1 to 5; and
$R_3$ and $R_5$ are independently selected from one of the following structures (3) to (38) or (40) to (41):
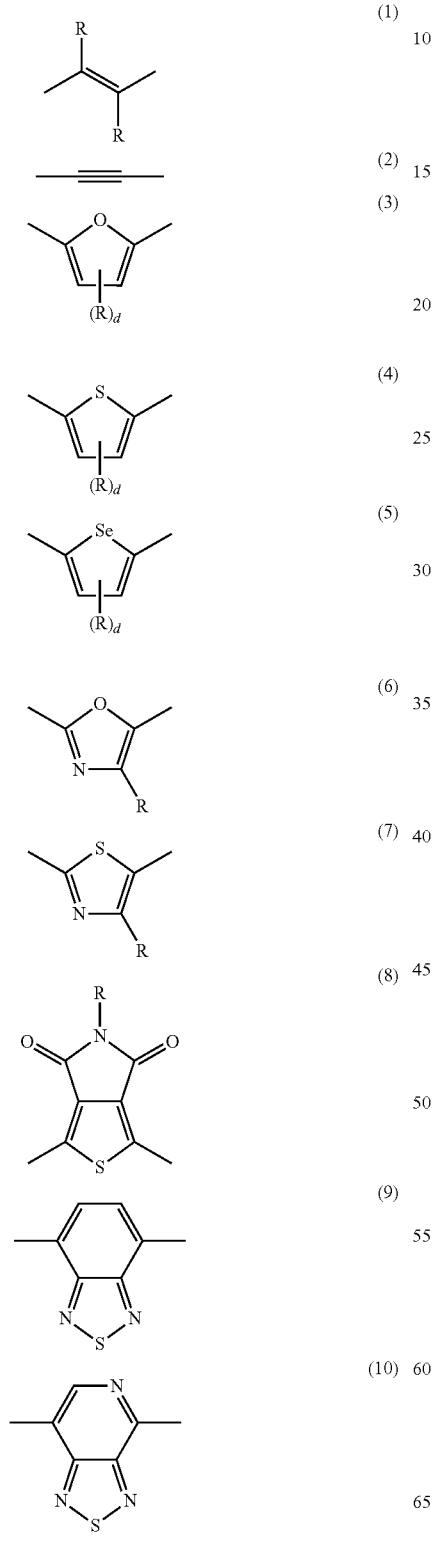
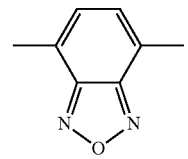
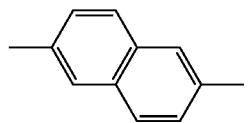
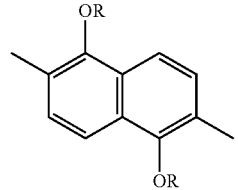
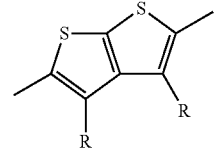
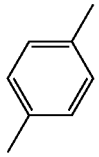
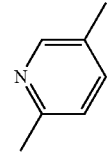
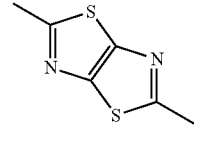
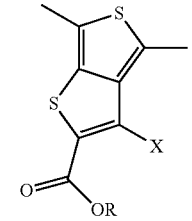
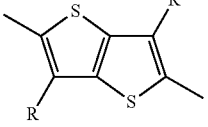

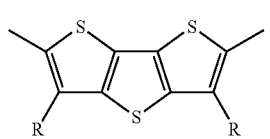
(20)
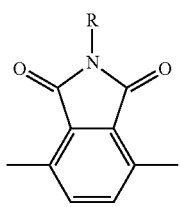
(21)
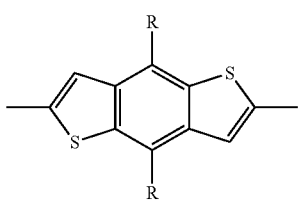
(22)
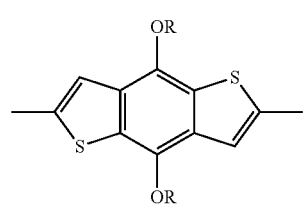
(23)
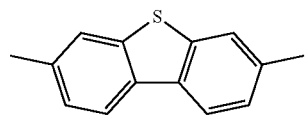
(24)
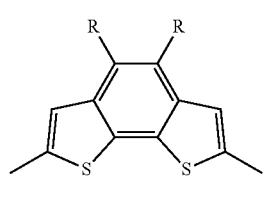
(25)
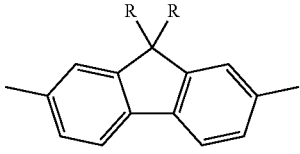
(26)
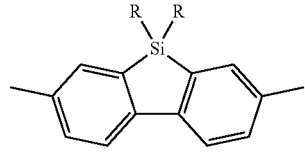
(27)
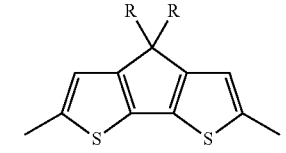
(28)
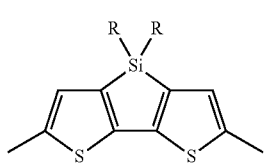
(29)
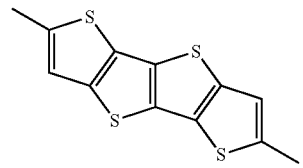
(30)
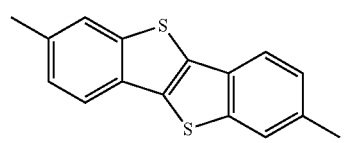
(31)
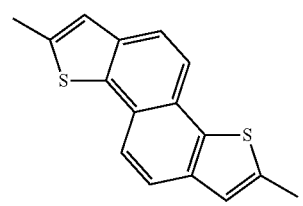
(32)
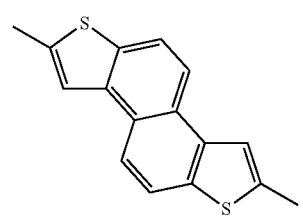
(33)
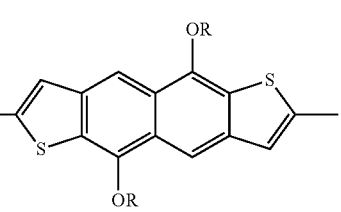
(34)
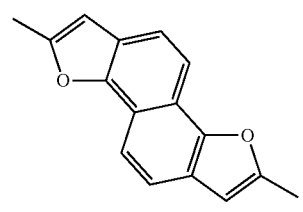
(35)
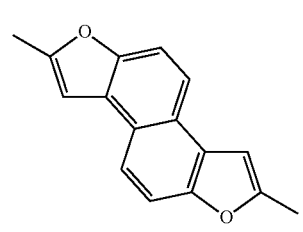
(36)

-continued

(37)
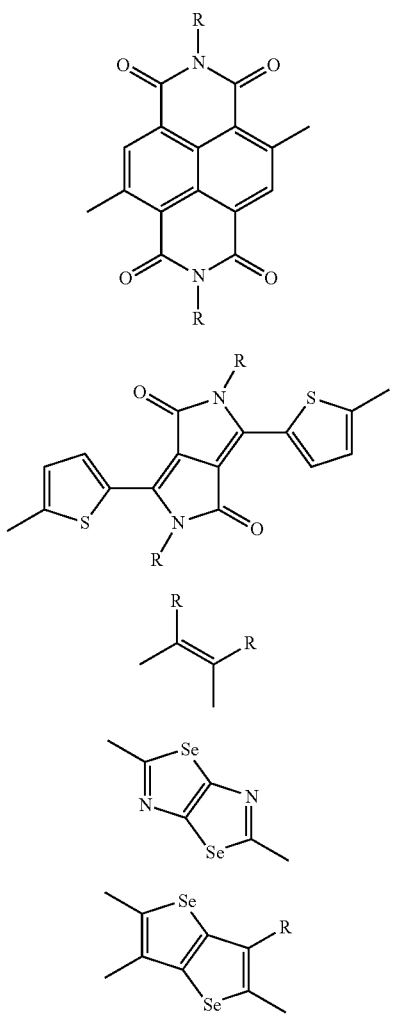
(38)
(39)
(40)
(41)

wherein R is independently selected from hydrogen, alkyl (linear or branched), substituted alkyl, alkoxy, alkylthio, aryl, substituted aryl, heteroaryl, substituted heteroaryl, X is H, F, or Cl, and d is 1 or 2.

3. The polymer according to claim 1, wherein the polymer has a formula selected from one of the following structures (42) to (73):

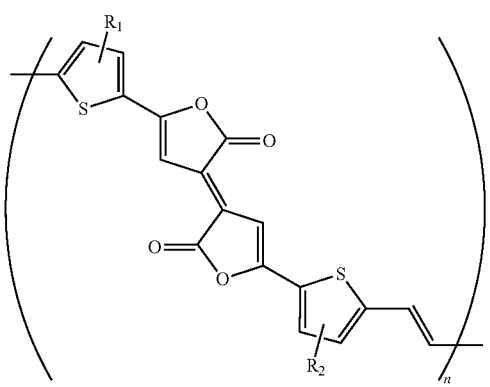
(45)

-continued

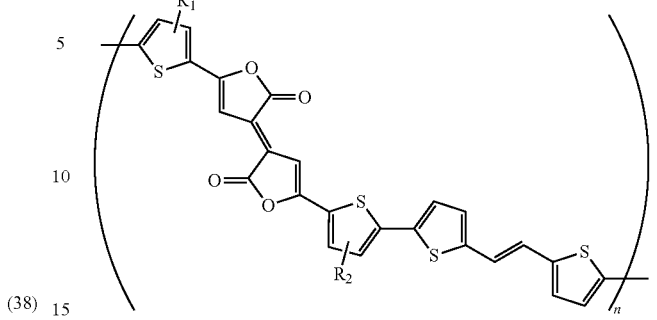
(56)

where R is independently selected from hydrogen, alkyl (linear or branched), substituted alkyl, alkoxy, alkylthio, aryl, substituted aryl, heteroaryl, substituted heteroaryl, X is H, F, or Cl, and $R_1$ and $R_2$ are as defined above.

4. The polymer according to claim 1, wherein at least one of a, b, and c is a non-zero integer.

5. The polymer according to claim 1, wherein at least one of a and c is 2 or 3.

6. The polymer according to claim 1, wherein at least one of $R_3$, or $R_5$ is a heteroaryl group, and the corresponding a or c is a non-zero integer.

7. The polymer according to claim 6, wherein the heteroaryl group includes at least one of S, N, Si, O or Se and has between 4 and 6 carbon atoms.

8. A film forming semiconductor composition comprising:
a solvent; and
a polymer of formula 1:

formula 1

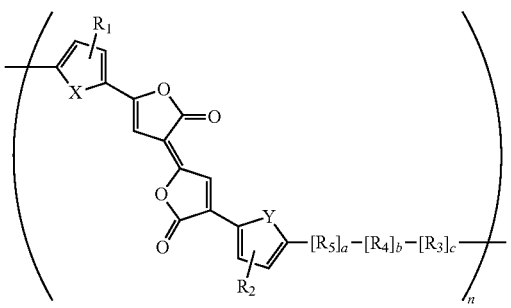

wherein X and Y are independently selected from O, S, or Se;

$R_5$ and $R_3$ is an aryl group containing from about 2 to about 36 carbon atoms, or a heteroaryl group containing from about 2 to about 30 carbon atoms and may be optionally substituted;

$R_1$ and $R_2$ are the same or different, and are selected from the group comprising a hydrogen, an alkyl group (linear or branched), a substituted alkyl group, an alkoxy group, an alkylthio group, an aryl group, a substituted aryl group;

a, b, and c are independently integers from 0 to 5;

and n is the number of repeat units from about 2 to about 5,000;

wherein $R_4$ is a substituted or unsubstituted alkene and b is 1 or 2.

9. The film forming semiconductor composition according to claim 8, wherein the polymer of formula 1 comprises about 0.1 to about 2 weight percent of the composition by weight.

10. The film forming semiconductor composition according to claim 8, wherein the solvent is toluene, xylenes, anisole, tetrahydronaphthalene, chlorobenzene, o-dichlorobenzene, chlorobutane, dichloroethane, chloroform, trichloroethane, or tetrachloroethane, or mixtures thereof.

11. An electronic device comprising the polymer of formula 1:

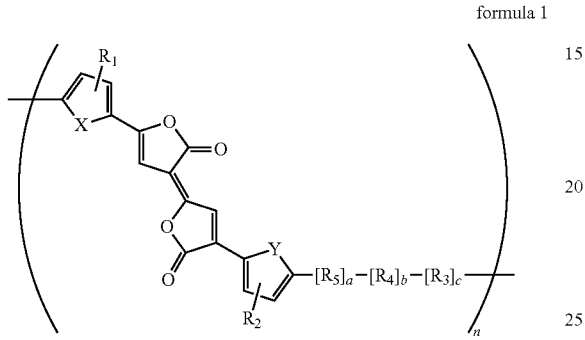

formula 1 wherein X and Y are independently selected from O, S, or Se;

$R_5$ and $R_3$ is an aryl group containing from about 2 to about 36 carbon atoms, or a heteroaryl group containing from about 2 to about 30 carbon atoms and may be optionally substituted;

$R_1$ and $R_2$ are the same or different, and are selected from the group comprising a hydrogen, an alkyl group (linear or branched), a substituted alkyl group, an alkoxy group, an alkylthio group, an aryl group, a substituted aryl group;

a, b, and c are independently integers from 0 to 5;

and n is the number of repeat units from about 2 to about 5000;

wherein $R_4$ is a substituted or unsubstituted alkene and b is 1 or 2.

12. The electronic device according to claim 11, wherein the electronic device is a thin film transistor.

13. The thin film transistor according to claim 12, wherein at least one of a, b, and c is an integer from 1 to 5; and $R_3$ and $R_5$ are independently selected from one of the following structures (3) to (38) or (40) to (41):

(1)

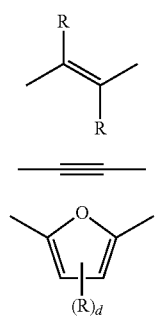

(2)

(3)

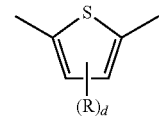

(4)

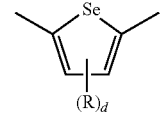

(5)

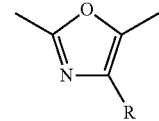

(6)

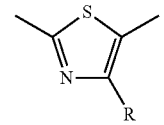

(7)

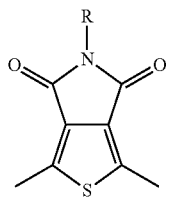

(8)

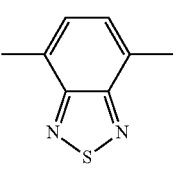

(9)

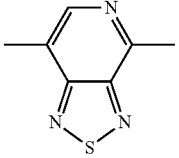

(10)

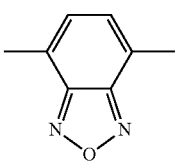

(11)

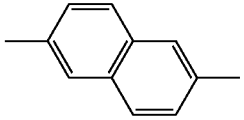

(12)

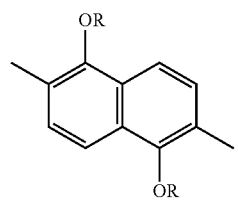

(13)

(14) 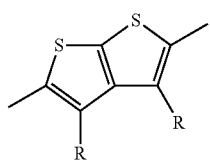
(15) 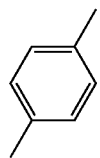
(16) 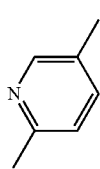
(17) 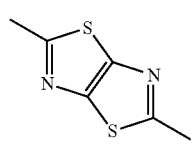
(18) 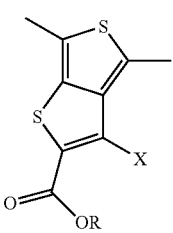
(19) 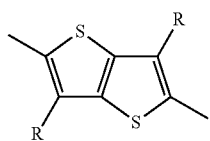
(20) 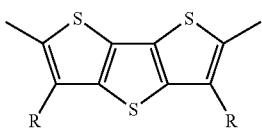
(21) 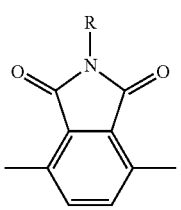
(22) 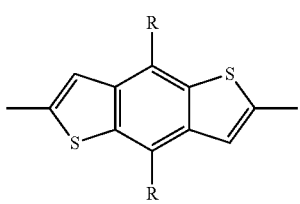
(23) 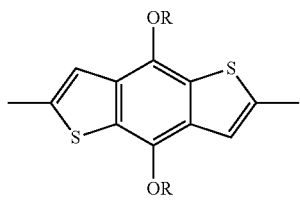
(24) 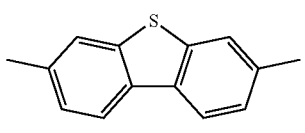
(25) 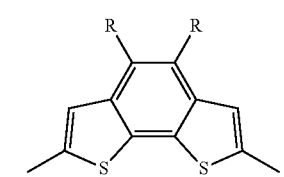
(26) 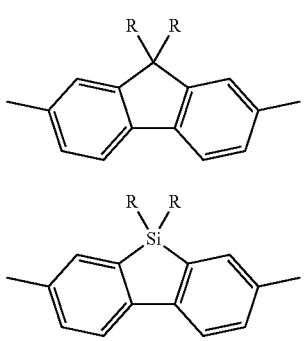
(27) 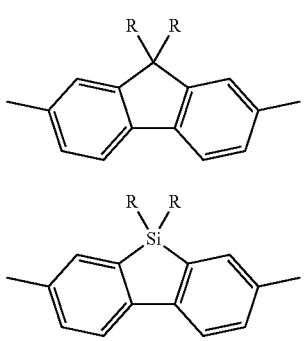
(28) 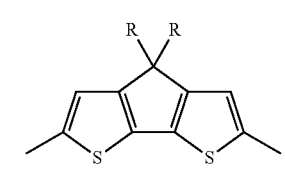
(29) 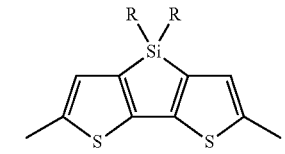
(30) 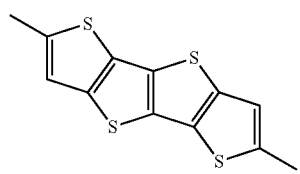
(31) 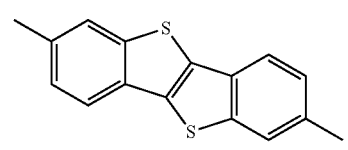

37
-continued

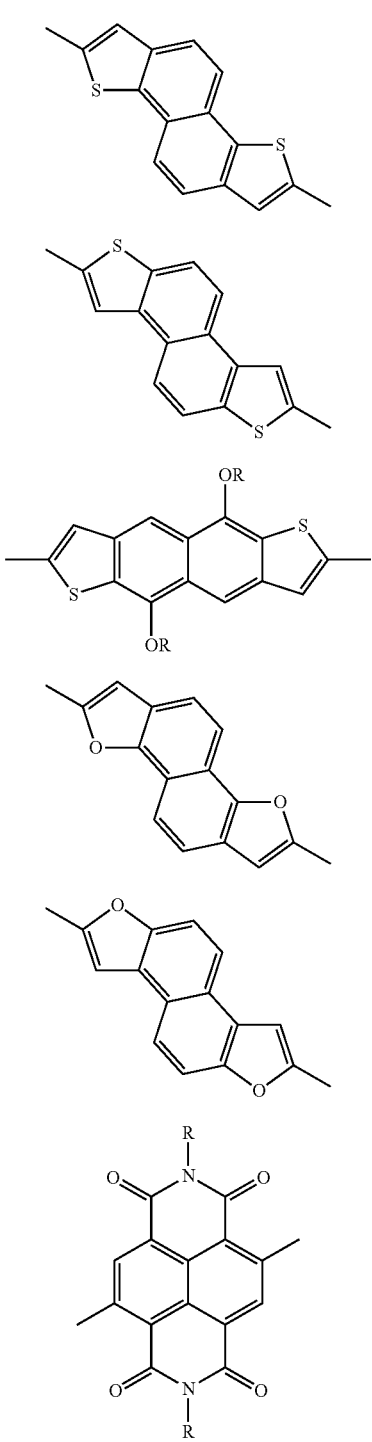

(32)

(33)

(34)

(35)

(36)

(37)

38
-continued

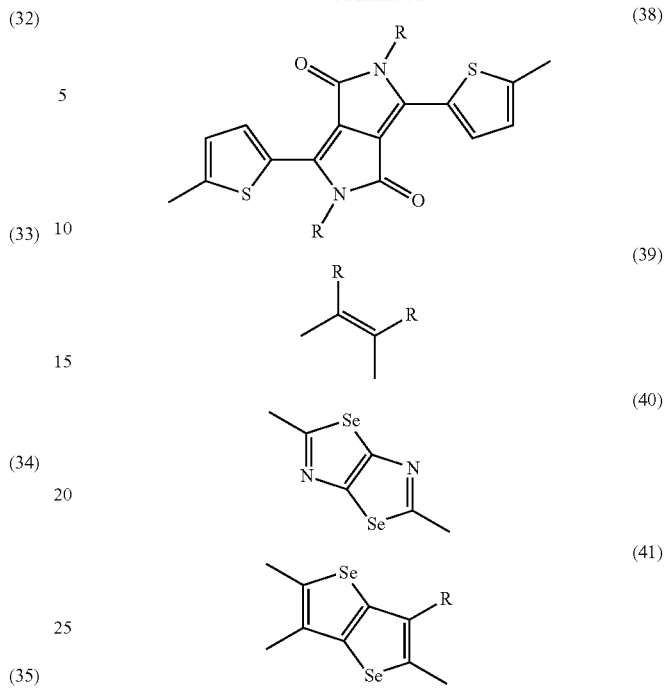

(38)

(39)

(40)

(41)

wherein R is independently selected from hydrogen, alkyl (linear or branched), substituted alkyl, alkoxy, aryl, alkylthio, substituted aryl, heteroaryl, substituted heteroaryl, X is H, F, or Cl, and d is 1 or 2.

14. The thin film transistor according to claim 12, wherein the device further comprises carbon nanotubes.

15. The thin film transistor according to claim 12, further comprising a dielectric layer that is provided between a substrate and the semiconductor layer and is surface modified with at least a hexamethyldisilazane (HMDS), a phenyltrichlorosilane, an octyltrichlorosilane (OTS-8), or an octadecyltrichlorosilane (ODTS-18).

16. The thin film transistor according to claim 12, wherein the field-effect mobility is about $10^{-3}$ to about 10 cm$^2$/(V·sec).

17. An electronic device according to claim 11, wherein the electronic device further comprises an unsubstituted fullerene or substituted fullerene derivative.

18. The electronic device according to claim 17, wherein the electronic device is a photovoltaic device.

19. The polymer according to claim 1, wherein X is S and Y is S.

20. The polymer according to claim 1, wherein $R_1$ and $R_2$ are the same or different, and are selected from the group comprising a hydrogen, an alkoxy group, an alkylthio group, an aryl group, and a substituted aryl group.

* * * * *